(12) United States Patent
Tanaka

(10) Patent No.: US 11,391,753 B2
(45) Date of Patent: Jul. 19, 2022

(54) INERTIAL SENSOR, ELECTRONIC INSTRUMENT, AND VEHICLE

(71) Applicant: Seiko Epson Corporation, Tokyo (JP)

(72) Inventor: Satoru Tanaka, Chino (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/912,929

(22) Filed: Jun. 26, 2020

(65) Prior Publication Data

US 2020/0408804 A1 Dec. 31, 2020

(30) Foreign Application Priority Data

Jun. 27, 2019 (JP) .............................. JP2019-120160

(51) Int. Cl.
*G01P 15/125* (2006.01)
*G01P 15/08* (2006.01)

(52) U.S. Cl.
CPC ........ *G01P 15/125* (2013.01); *G01P 15/0802* (2013.01); *G01P 2015/0831* (2013.01)

(58) Field of Classification Search
CPC .................................................. G01P 15/125
See application file for complete search history.

(56) References Cited

U.S. PATENT DOCUMENTS

| | | |
|---|---|---|
| 5,488,864 A | 2/1996 | Stephan |
| 6,935,175 B2 | 8/2005 | Eskridge et al. |
| 2010/0024553 A1 | 2/2010 | Classen et al. |
| 2016/0061858 A1* | 3/2016 | Tanaka .................. G01P 15/131 73/514.18 |
| 2019/0025338 A1 | 1/2019 | Matsuura |
| 2019/0063924 A1 | 2/2019 | Tanaka |
| 2020/0081028 A1* | 3/2020 | Zhang .................. G01P 15/125 |

FOREIGN PATENT DOCUMENTS

| | | |
|---|---|---|
| EP | 2100151 B1 | 3/2017 |
| JP | H08-220134 A | 8/1996 |
| JP | 2019-045172 A | 3/2019 |

* cited by examiner

*Primary Examiner* — Walter L Lindsay, Jr.
*Assistant Examiner* — Andrew V Do
(74) *Attorney, Agent, or Firm* — Harness, Dickey & Pierce, P.L.C.

(57) ABSTRACT

An inertial sensor includes a movable element including a first movable section and a second movable section, a first detection electrode, and a first dummy electrode. The first movable section has a first section, a second section that is farther from the swing axis than the first section, and a third section disposed between the first section and second section. A separation distance between the third section and the first dummy electrode is greater than a separation distance between the first section and the first detection electrode.

13 Claims, 12 Drawing Sheets

INERTIAL SENSOR, ELECTRONIC INSTRUMENT, AND VEHICLE

The present application is based on, and claims priority from JP Application Serial Number 2019-120160, filed Jun. 27, 2019, the disclosure of which is hereby incorporated by reference herein in its entirety.

BACKGROUND

1. Technical Field

The present disclosure relates to an inertial sensor, an electronic instrument, and a vehicle.

2. Related Art

For example, an inertial sensor described in JP-A-2019-45172 is an acceleration sensor capable of detecting acceleration in an axis-Z direction and includes a substrate, a movable element that performs seesaw swing relative to the substrate around a swing axis extending along an axis-Y direction, and a detection electrode provided on the substrate. The movable element includes a first movable section and a second movable section that are so provided as to sandwich the swing axis and differ in rotational moment around the swing axis from each other. The detection electrode includes a first detection electrode so disposed on the substrate as to face the first movable section and a second detection electrode so disposed on the substrate as to face the second movable section. A dummy electrode so disposed on the substrate as to face a front end portion of the first movable section is provided on the side farther from the swing axis than the first detection electrode. The dummy electrode has the same potential as that at the movable element and has the function of suppressing occurrence of unnecessary electrostatic attraction between the movable element and the substrate.

When acceleration in the axis-Z direction acts on the inertial sensor having the configuration described above, the movable element performs the seesaw swing around the swing axis, and the capacitance between the first movable section and the first detection electrode and the capacitance between the second movable section and the second detection electrode change accordingly in opposite phases. The acceleration in the axis-Z direction can therefore be detected based on the changes in the capacitance.

In the inertial sensor described in JP-A-2019-45172, however, the separation distance between the movable element and the first detection electrode is equal to the separation distance between the movable element and the second detection electrode. In the configuration described above, the smaller the separation distance between the movable element and the first detection electrode, the greater the capacitance therebetween, whereby the acceleration detection sensitivity is improved. However, since the separation distance between the movable element and the dummy electrode also decreases, the air resistance therebetween increases, so that damping of the movable element is likely to occur. It is therefore difficult to achieve desired frequency characteristics. Conversely, the greater the separation distance between the movable element and the first detection electrode, the smaller the capacitance therebetween, whereby the acceleration detection sensitivity decreases. However, since the separation distance between the movable element and the dummy electrode also increases, the air resistance therebetween decreases, so that damping of the movable element is unlikely to occur. Desired frequency characteristics are therefore readily achieved. That is, it is difficult for the inertial sensor described in JP-A-2019-45172 to achieve excellent detection sensitivity with a desired frequency band ensured.

SUMMARY

An inertial sensor described in an embodiment includes, provided that axes X, Y, and Z are three axes perpendicular to one another, a substrate, a movable element that swings around a swing axis extending along the axis Y, and an electrode that is disposed on the substrate and overlaps with the movable element in a plan view along the axis-Z direction. The movable element includes a first movable section and a second movable section so provided as to sandwich the swing axis in the plan view along the axis-Z direction. The first movable section includes a symmetrical section that is so provided that the symmetrical section and the second movable section are symmetrical with respect to the swing axis in the plan view along the axis-Z direction and an asymmetrical section that is farther from the swing axis than the symmetrical section and so provided that the asymmetrical section and the second movable section are asymmetrical with respect to the swing axis in the plan view along the axis-Z direction, with rotational moment of the first movable section around the swing axis being greater than rotational moment of the second movable section around the swing axis. The electrode includes a first detection electrode that is so provided as to overlap with the symmetrical section of the first movable section in the plan view along the axis-Z direction and a first dummy electrode that is so provided as to overlap with the symmetrical section and the asymmetrical section of the first movable section on a side farther from the swing axis than the first detection electrode and has the same potential as potential at the movable element. A separation distance between the symmetrical section and the first dummy electrode is greater than a separation distance between the symmetrical section and the first detection electrode.

DESCRIPTION OF EXEMPLARY EMBODIMENTS

An inertial sensor, an electronic instrument, and a vehicle according to the present disclosure will be described below in detail based on embodiments shown in the accompanying drawings.

First Embodiment

Figure 1:
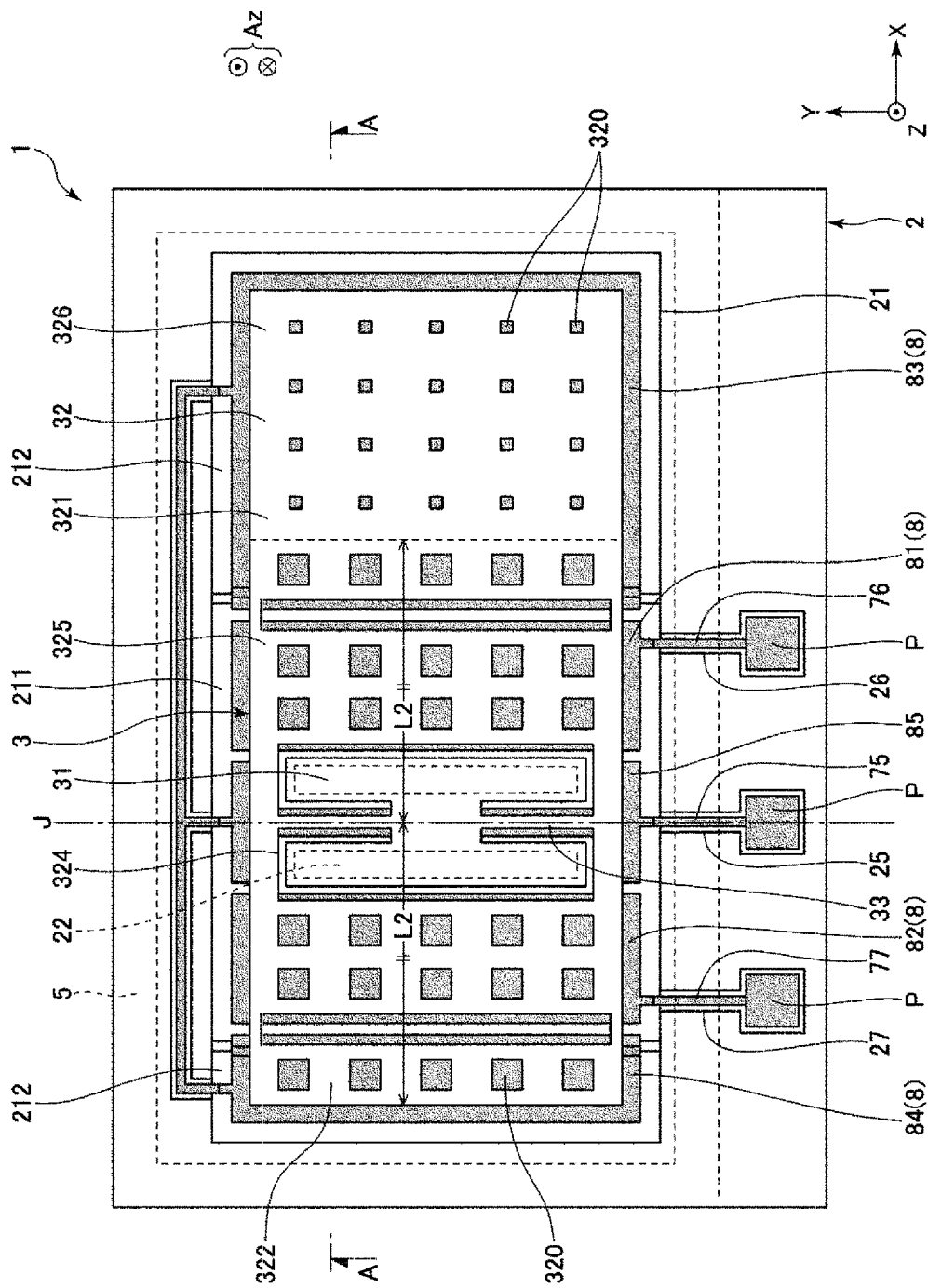
FIG. 1 is a plan view showing an inertial sensor according to a first embodiment.
Figure 2:
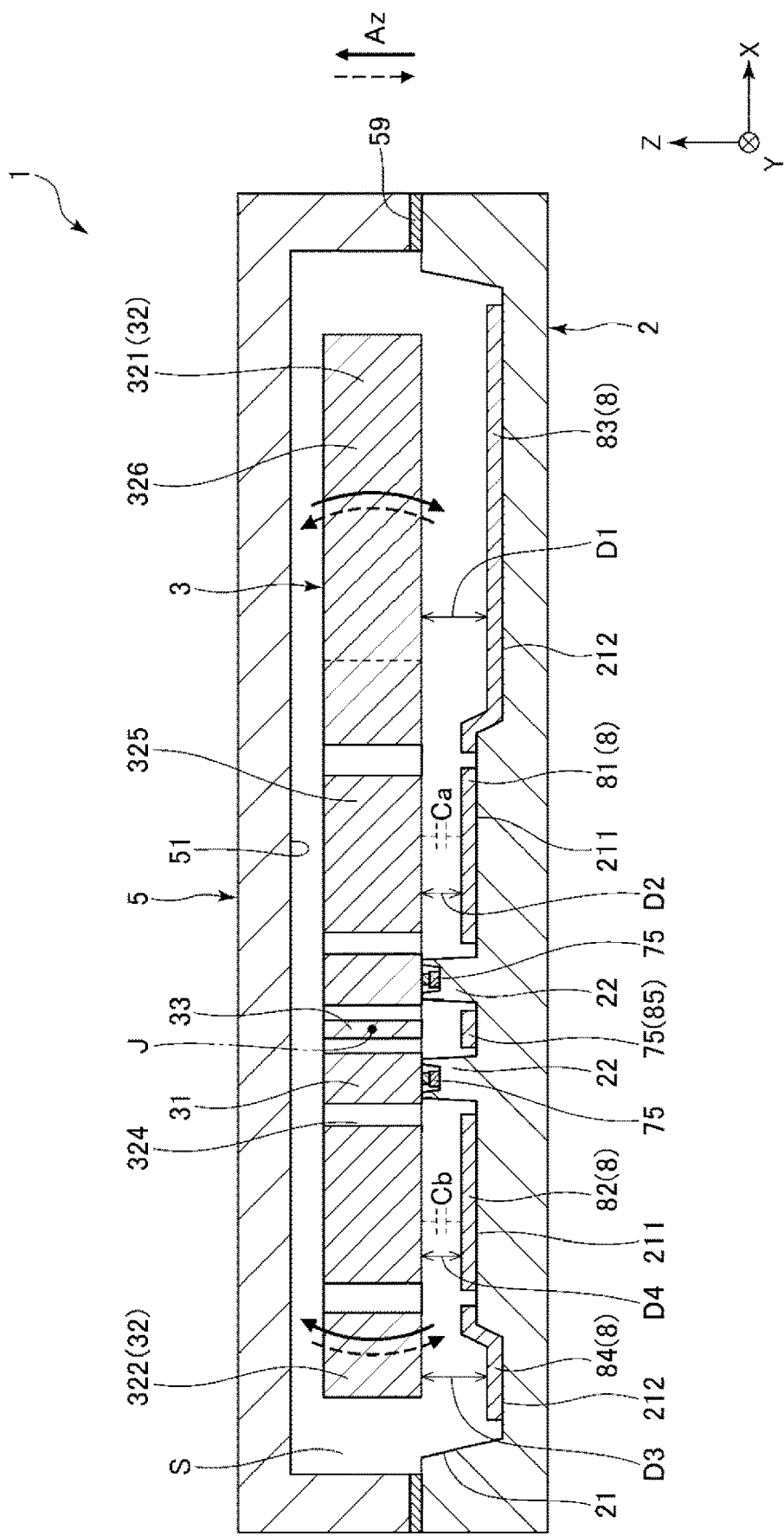
FIG. 2 is a cross-sectional view of the inertial sensor taken along the line A-A in FIG. 1.

FIG. 1 is a plan view showing an inertial sensor according to a first embodiment. FIG. 2 is a cross-sectional view of the inertial sensor taken along the line A-A in FIG. 1.

In the following description, three axes perpendicular to one another, axes X, Y, and Z are drawn for convenience of the description. The direction along the axis X, that is, the direction parallel to the axis X is also called an "axis-X direction," the direction along the axis Y, that is, the direction parallel to the axis Y is also called an "axis-Y direction," and the direction along the axis Z, that is, the direction parallel to the axis Z is also called an "axis-Z direction." The side facing the front end of the arrow of each of the axes is also called a "positive side," and the side opposite the positive side is also called a "negative side." The positive side of the axis-Z direction is also called "upper," and the negative side of the axis-Z direction is also called "lower."

In the specification of the present application, the state expressed by the term "perpendicular" includes a state comparable to "perpendicular" in a technical common sense, specifically, a state in which two lines intersect each other at 90° and also a state in which two lines intersect each other at an angle that slightly deviates from 90°, for example, an angle that falls within 90°±about 5°. Similarly, the state expressed by the term "parallel" includes a state comparable to "parallel" in a technical common sense, specifically, a state in which the angle between two lines is 0° and also a state in which the angle between two lines deviates from 0° by about ±5°.

An inertial sensor 1 shown in FIGS. 1 and 2 is an acceleration sensor that detects acceleration Az in the axis-Z direction. The inertial sensor 1 includes a substrate 2, a sensor device 3, which is disposed on the substrate 2, and a lid 5, which is bonded to the substrate 2 and covers the sensor device 3.

The substrate 2 has a recess 21, which opens toward the upper side, as shown in FIG. 1. In the plan view along the axis-Z direction, the recess 21 is so formed as to accommodate the sensor device 3 and to be larger than the sensor device 3. The thus configured recess 21 functions as a clearance for preventing contact between the sensor device 3 and the substrate 2. The substrate 2 includes amount 22, which protrudes from the bottom surface of the recess 21, as shown in FIG. 2. The sensor device 3 is bonded to the upper surface of the mount 22. The substrate 2 has grooves 25, 26, and 27, which open via the upper surface of the substrate 2, as shown in FIG. 1.

The substrate 2 can, for example, be a glass substrate made of a glass material containing an alkali metal ion that is a movable ion, such as Na$^+$, for example, borosilicate glass, such as Pyrex glass and Tempax glass (both are registered trademark). The substrate 2 is, however, not limited to a specific substrate and may instead, for example, be a silicon substrate or a ceramic substrate.

The substrate 2 is provided with an electrode 8, as shown in FIG. 1. The electrode 8 includes a first detection electrode 81, a second detection electrode 82, a first dummy electrode 83, and a second dummy electrode 84, which are disposed on the bottom surface of the recess 21 and overlap with the sensor device 3 in the plan view along the axis-Z direction. The substrate 2 further includes wiring lines 75, 76, and 77 disposed in the grooves 25, 26, and 27, respectively.

One end portion of each of the wiring lines 75, 76, and 77 functions as an electrode pad P, which is exposed to the region outside the lid 5 and electrically couples the inertial sensor 1 to an external apparatus. The wiring line 75 is electrically coupled to the sensor device 3 and the first and second dummy electrodes 83, 84. That is, the first and second dummy electrodes 83, 84 have the same potential as that at a movable element 32. The wiring line 75 is so formed as to have a largest possible width between the first detection electrode 81 and the second detection electrode 82 and provides the same function as that of the first and second dummy electrodes 83, 84. In the following description, the wide portion of the wiring line 75 on the bottom surface of the recess 21 is also called a "third dummy electrode 85." The wiring line 76 is electrically coupled to the first detection electrode 81, and the wiring line 77 is electrically coupled to the second detection electrode 82.

The lid 5 has a recess 51, which opens via the lower surface of the lid 5, as shown in FIG. 2. The lid 5 is so bonded to the upper surface of the substrate 2 as to accommodate the sensor device 3 in the recess 51. The lid 5 and the substrate 2 form an internal accommodation space S, which accommodates the sensor device 3. It is preferable that the accommodation space S is a hermetically sealed space and is filled with an inert gas, such as nitrogen, helium, and argon, and that the pressure of the inert gas that fills the accommodation space S is substantially equal to the atmospheric pressure at the temperature at which the inertial sensor 1 is used (from about –40° C. to 125° C.). It is, however, noted that the accommodation space S does not necessarily have a specific atmosphere and may be, for example, under pressure higher or lower than the atmospheric pressure.

The lid 5 can, for example, be a silicon substrate. It is, however, noted that the lid 5 is not necessarily formed of a specific substrate and may, for example, be formed of a glass substrate or a ceramic substrate. The method for bonding the substrate 2 and the lid 5 to each other is not limited to a specific method and may be selected as appropriate in accordance with the materials of the substrate 2 and the lid 5. For example, the method can be anodic bonding, activation bonding in which bonding surfaces activated by plasma radiation are bonded to each other, bonding using a bonding material, such as glass frit, and diffusion bonding in which a metal film deposited on the upper surface of the substrate 2 and a metal film deposited on the lower surface of the lid 5 are bonded to each other. In the present embodiment, the substrate 2 and the lid 5 are bonded to each other with glass frit 59, which is made of low-melting-point glass.

The sensor device 3 is formed, for example, by etching an electrically conductive silicon substrate into which an impurity, such as phosphorus (P), boron (B), and arsenic (As), has been doped, particularly, patterning the silicon substrate in a Bosch process, which is a deep-groove etching technology. The sensor device 3 includes an H-shaped fixed section 31, which is bonded to the upper surface of the mount 22, the movable element 32, which is swingable relative to the fixed section 31 around a swing axis J extending along the axis Y, and swing beams 33, which connect the fixed section 31 to the movable element 32, as shown in FIG. 1. The fixed section 31 is bonded to the mount 22, for example, in anodic bonding.

The movable element 32 has an oblong shape having a longitudinal direction that coincides with the axis-X direction in the plan view along the axis-Z direction. The movable element 32 includes a first movable section 321 and a second movable section 322 so disposed as to sandwich the swing axis J extending along the axis Y in the plan view along the axis-Z direction. The first movable section 321 is located on the positive side of the swing axis J in the axis-X direction, and the second movable section 322 is located on the negative side of the swing axis J in the axis-X direction. The first movable section 321 is longer than the second movable section 322 in the axis-X direction, and the rotational moment of the first movable section 321 around the swing axis J produced when the acceleration Az acts on the inertial sensor 1 is greater than that of the second movable section 322.

The difference in the rotational moment causes the movable element 32 to perform seesaw swing around the swing axis J when the acceleration Az acts on the inertial sensor 1. The seesaw swing means that displacement of the first movable section 321 toward the positive side of the axis-Z direction causes displacement of the second movable section 322 toward the negative side of the axis-Z direction, and that conversely, displacement of the first movable section 321 toward the negative side of the axis-Z direction causes displacement of the second movable section 322 toward the positive side of the axis-Z direction.

The movable element 32 has an opening 324, which is located between the first movable section 321 and the second movable section 322 and formed of a through hole passing through the movable element 32 in the thickness direction thereof. The fixed section 31 and the swing beams 33 are disposed in the opening 324. Since the fixed section 31 and the swing beams 33 are thus disposed inside the movable element 32, the size of the sensor device 3 can be reduced. The fixed section 31 and the swing beams 33 are, however, not necessarily disposed inside the movable element 32 and may instead be disposed in a region outside the movable element 32.

The movable element 32 has a plurality of through holes 320 uniformly provided across the first and second movable sections 321, 322. The through holes 320 are so formed as to pass through the movable element 32 in the thickness direction thereof, that is, in the axis-Z direction and have the function of reducing air-resistance-induced damping of the movable element 32. In the present embodiment, the through holes 320 each have a square opening shape, but not necessarily, and may instead each have, for example, a circular shape, a quadrangular shape excluding a square shape, or any other rectangular shape. The through holes 320 are not necessarily arranged in a specific manner and may be arranged in a partly sparse/dense manner.

Now, return to the description of the electrode 8 disposed on the bottom surface of the recess 21. In the plan view along the axis-Z direction, the first detection electrode 81 is so disposed as to overlap with a base portion of the first movable section 321, and the second detection electrode 82 is so disposed as to overlap with a base portion of the second movable section 322, as shown in FIGS. 1 and 2. The first and second detection electrodes 81, 82 are provided symmetrically with respect to the swing axis J in the plan view along the axis-Z direction.

The first dummy electrode 83 is located on the positive side of the first detection electrode 81 in the axis-X direction and so disposed as to overlap with a front end portion of the first movable section 321, and the second dummy electrode 84 is located on the negative side of the second detection electrode 82 in the axis-X direction and so disposed as to overlap with a front end portion of the second movable section 322. That is, the first dummy electrode 83 faces a portion of the first movable section 321 that is a portion farther from the swing axis J than the portion facing the first detection electrode 81, and the second dummy electrode 84 faces a portion of the second movable section 322 that is a portion farther from the swing axis J than the portion facing the second detection electrode 82. The wiring line 75 having the same function as that of the first and second dummy electrodes 83, 84 is provided between the first detection electrode 81 and the second detection electrode 82, as described above.

Providing the first, second, and third dummy electrodes 83, 84, 85, which have the same potential as that at the movable element 32, in regions that surround the first and second detection electrode 81, 82, as described above, allows suppression of exposure of the bottom surface of the recess 21 in the region where the bottom surface overlaps with the movable element 32. The configuration described above effectively prevents the bottom surface of the recess 21 from being charged resulting from the movement of the alkali metal ion ($Na^+$) in the substrate 2 and further effectively prevents unnecessary electrostatic attraction from being produced between the bottom surface of the recess 21 and the movable element 32 resulting from the charged bottom surface. Swing motion of the movable element 32 induced by force other than the acceleration Az, which is the detection target, can therefore be effectively suppressed, and degradation in characteristics in accordance with which the acceleration Az is detected can in turn be suppressed.

Although not shown, when the inertial sensor 1 is driven, drive voltage is applied to the sensor device 3 via the wiring line 75. To this end, the first detection electrode 81 is coupled to a QV amplifier via the wiring line 76, and the second detection electrode 82 is coupled to another QV amplifier via the wiring line 77. As a result, capacitance Ca is formed between the first movable section 321 and the first detection electrode 81, and capacitance Cb is formed between the second movable section 322 and the second detection electrode 82.

When the inertial sensor 1 performs accelerated motion at the acceleration Az, the movable element 32 performs seesaw swing around the swing axis J. The seesaw swing of the movable element 32 changes the gap between the first movable section 321 and the first detection electrode 81 and the gap between the second movable section 322 and the second detection electrode 82 in opposite phases, and the capacitance Ca and the capacitance Cb change in opposite phases accordingly. The inertial sensor 1 can therefore detect the acceleration Az based on the difference between the capacitance Ca and the capacitance Cb (amount of change in capacitance).

The configuration of the inertial sensor 1 has been briefly described. The configuration of the movable element 32 will next be described in detail. The movable element 32 includes the first movable section 321 and the second movable section 322 so disposed as to sandwich the swing axis J, the first movable section 321 is longer than the second movable section 322 in the axis-X direction, and the rotational moment of the first movable section 321 around the swing axis J produced when the acceleration Az acts on the inertial sensor 1 is greater than that of the second movable section 322, as described above.

The first movable section 321 includes a symmetrical section 325, which is so provided that the symmetrical section 325 and the second movable section 322 are symmetrical with respect to the swing axis J in the plan view along the axis-Z direction, and an asymmetrical section 326, which is farther from the swing axis J than the symmetrical section 325 and so provided that the asymmetrical section 326 and the second movable section 322 are asymmetrical with respect to the swing axis J in the plan view along the axis-Z direction, as shown in FIG. 1. Let L2 be the length of the second movable section 322 that is the length measured from the swing axis J, and the line where the length of the first movable section 321 that is the length measured from the swing axis J is equal to the length L2 is the boundary between the symmetrical section 325 and the asymmetrical section 326. Out of the first movable section 321, the portion on one side of the line that is the side facing the swing axis J is the symmetrical section 325, and the portion opposite the swing axis J with respect to the symmetrical section 325 is the asymmetrical section 326. The asymmetrical section 326 functions as a torque generator for causing the rotational moment of the first movable section 321 around the swing axis J to be greater than the rotational moment of the second movable section 322 around the swing axis J.

The state in which the second movable section 322 and the symmetrical section 325 are symmetrical with respect to the swing axis J means that the outer shape of the second movable section 322 and the outer shape of the symmetrical section 325 are symmetrical with respect to the swing axis J in the plan view along the axis-Z direction. The state expressed by the term "symmetrical" includes a state in which the outer shape of the second movable section 322 and the outer shape of the symmetrical section 325 are fully symmetrical and, for example, a state in which the outer shapes described above contain possible manufacturing and design errors.

The description of the electrode 8 is now resumed. In the plan view along the axis-Z direction, the first detection electrode 81 is so provided as to overlap with a base portion of the symmetrical section 325 of the first movable section 321, and the first dummy electrode 83 is so provided as to overlap with the following two portions: a front end portion of the symmetrical section 325 of the first movable section 321, that is, a portion of the symmetrical section 325 that is the portion farther from the swing axis J than the first detection electrode 81; and the asymmetrical section 326. Further, in the plan view along the axis-Z direction, the second detection electrode 82 is so provided as to overlap with the base portion of the second movable section 322, and the second dummy electrode 84 is so provided as to overlap with the front end portion of the second movable section 322, that is, the portion farther from the swing axis J than the second detection electrode 82.

The recess 21 is so formed that portions 212, where the first dummy electrodes 83, 84 are provided, are deeper than portions 211, where the first and second detection electrodes 81, 82 are provided, in the plan view along the axis-Z direction, as shown in FIG. 2. A separation distance D1 between the first movable section 321 and the first dummy electrode 83 is therefore greater than a separation distance D2 between the first movable section 321 and the first detection electrode 81. Similarly, a separation distance D3 between the second movable section 322 and the second dummy electrode 84 is therefore greater than a separation distance D4 between the second movable section 322 and the second detection electrode 82. That is, D1>D2 and D3>D4 are satisfied.

When D1>D2 and D3>D4 are satisfied, the separation distance D2 between the first movable section 321 and the first detection electrode 81 and the separation distance D4 between the second movable section 322 and the second detection electrode 82 can be reduced to increase the capacitance Ca and Cb, whereby the acceleration Az is detected at more excellent sensitivity. On the other hand, the separation distance D1 between the first movable section 321 and the first dummy electrode 83 and the separation distance D3 between the second movable section 322 and the second dummy electrode 84 can be increased to lower the viscosity resistance of the air present between the movable element 32 and the substrate 2. As a result, the air resistance that occurs when the movable element 32 swings lowers, and the damping of the movable element 32 can therefore be reduced, whereby a desired frequency band of the inertial sensor 1 is readily ensured. Therefore, according to the configuration described above, an inertial sensor 1 capable of providing excellent detection sensitivity with a desired frequency band ensured is achieved.

In particular, providing the first dummy electrode 83 in such a way that the first dummy electrode 83 overlaps with not only the asymmetrical section 326 but the front end section of the symmetrical section 325 in the plan view along the axis-Z direction and achieving the state in which D1>D2 is satisfied also in the front end portion allow a wider region of the first movable section 321 to be a region where the separation distance to the first movable section 321 is D1. Further, providing the second dummy electrode 84 in such a way that the second dummy electrode 84 overlaps with the front end section of the second movable section 322 in the plan view along the axis-Z direction and achieving the state in which D3>D4 is satisfied in the front end portion allow part of the second movable section 322 to be a region where the separation distance to the second movable section 322 is D3. As a result, the air resistance that occurs when the movable element 32 swings can be more effectively lowered, and the damping of the movable element 32 can therefore be more effectively reduced, whereby a desired frequency band of the inertial sensor 1 is more readily ensured.

The relationship between D1 and D2 is not specifically restricted as long as D1>D2 is satisfied. However, for example, it is preferable that $1.1 \leq D1/D2 \leq 10.0$ is satisfied, and it is more preferable that $1.5 \leq D1/D2 \leq 6.5$ is satisfied. Therefore, the effect described above can be more reliably provided, and an excessive increase in the size of the inertial sensor, in particular, the thickness of the inertial sensor can be suppressed. Similarly, the relationship between D3 and D4 is not specifically restricted as long as D3>D4 is satisfied. However, for example, it is preferable that $1.1 \leq D3/D4 \leq 10.0$ is satisfied, and it is more preferable that $1.5 \leq D3/D4 \leq 6.5$ is satisfied. Therefore, the effect described above can be more reliably provided, and an excessive increase in the size of the inertial sensor, in particular, the thickness of the inertial sensor can be suppressed. In the present embodiment, D1=D3 and D2=D4 are satisfied, but not necessarily, and D1≠D3 or D2≠D4 may instead be satisfied.

The inertial sensor 1 has been described. The thus configured inertial sensor 1 includes, provided that the axes X, Y, and Z are three axes perpendicular to one another, the substrate 2, the movable element 32, which swings around the swing axis J extending along the axis Y, and the electrode 8, which is disposed on the substrate 2 and overlaps with the movable element 32 in the plan view along the axis-Z direction, as described above. The movable element 32 includes the first movable section 321 and the second movable section 322 so provided as to sandwich the swing axis J in the plan view along the axis-Z direction. The first movable section 321 includes the symmetrical section 325, which is so provided that the symmetrical section 325 and the second movable section 322 are symmetrical with respect to the swing axis J in the plan view along the axis-Z direction, and the asymmetrical section 326, which is farther from the swing axis J than the symmetrical section 325 and so provided that the asymmetrical section 326 and the second movable section 322 are asymmetrical with respect to the swing axis J in the plan view along the axis-Z direction, and the rotational moment of the first movable section 321 around the swing axis J is greater than that of the second movable section 322. The electrode 8 includes the first detection electrode 81, which is so provided as to overlap with the symmetrical section 325 of the first movable section 321 in the plan view along the axis-Z direction, and the first dummy electrode 83, which is so provided as to overlap with the symmetrical section 325 and the asymmetrical section 326 of the first movable section 321 on the side farther from the swing axis J than the first detection electrode 81 and has the same potential as that at the movable element 32. The separation distance D1 between the symmetrical section 325 and the first dummy electrode 83 is greater than the separation distance D2 between the symmetrical section 325 and the first detection electrode 81. That is, D1>D2 is satisfied.

According to the configuration described above, an inertial sensor 1 capable of providing excellent detection sensitivity with a desired frequency band ensured is achieved. Specifically, achieving the state in which D1>D2 is satisfied allows a decrease in the separation distance D2 between the first movable section 321 and the first detection electrode 81, whereby the capacitance Ca formed between the first movable section 321 and the first detection electrode 81 can be sufficiently increased. The acceleration Az is therefore detected at more excellent sensitivity. Conversely, since the separation distance D1 between the symmetrical section 325 and the first dummy electrode 83 can be increased, the viscosity resistance of the air present between the first movable section 321 and the substrate 2 can be lowered. The air resistance that occurs when the movable element 32 swings therefore lowers, and the damping of the movable element 32 can therefore be reduced, whereby a desired frequency band of the inertial sensor 1 is readily ensured. Therefore, according to the configuration described above, an inertial sensor 1 capable of providing excellent detection sensitivity with a desired frequency band ensured is achieved.

Further, the separation distance D1 between the asymmetrical section 326 and the first detection electrode 81 is greater than the separation distance D2 between the symmetrical section 325 and the first detection electrode 81, as described above. The configuration described above can increase the separation distance not only between the symmetrical section 325 and the first dummy electrode 83 but between the asymmetrical section 326 and the first dummy electrode 83. The viscosity resistance of the air present between the first movable section 321 and the substrate 2 can be further lowered, so that the air resistance that occurs when the movable element 32 swings further lowers. As a result, the damping of the movable element 32 can be more effectively reduced, whereby a desired frequency band of the inertial sensor 1 is readily ensured.

The electrode 8 includes the second detection electrode 82, which is so provided as to overlap with the second movable section 322 in the plan view along the axis-Z direction, and the second dummy electrode 84, which is so provided as to overlap with the second movable section 322 on the side farther from the swing axis J than the second detection electrode 82 and has the same potential as that at the movable element 32, as described above. The separation distance D3 between the second movable section 322 and the second dummy electrode 84 is greater than the separation distance D4 between the second movable section 322 and the second detection electrode 82. That is, D3>D4 is satisfied.

According to the configuration described above, the separation distance D4 between the second movable section 322 and the second detection electrode 82 can be reduced, whereby the capacitance Cb formed between the second movable section 322 and the second detection electrode 82 can be sufficiently increased. The acceleration Az is therefore detected at more excellent sensitivity. Conversely, since the separation distance between the second movable section 322 and the second dummy electrode 84 can be increased, the viscosity resistance of the air present between the second movable section 322 and the substrate 2 can be lowered. The air resistance that occurs when the movable element 32 swings therefore lowers, and the damping of the movable element 32 can therefore be reduced, whereby a desired frequency band of the inertial sensor 1 is readily ensured.

The through holes 320, which pass through the movable element 32 in the axis-Z direction, are provided in each of the first movable section 321 and the second movable section 322, as described above. The air resistance therefore lowers, whereby the air-resistance-induced damping of the movable element 32 can be effectively reduced.

Second Embodiment

Figure 3:
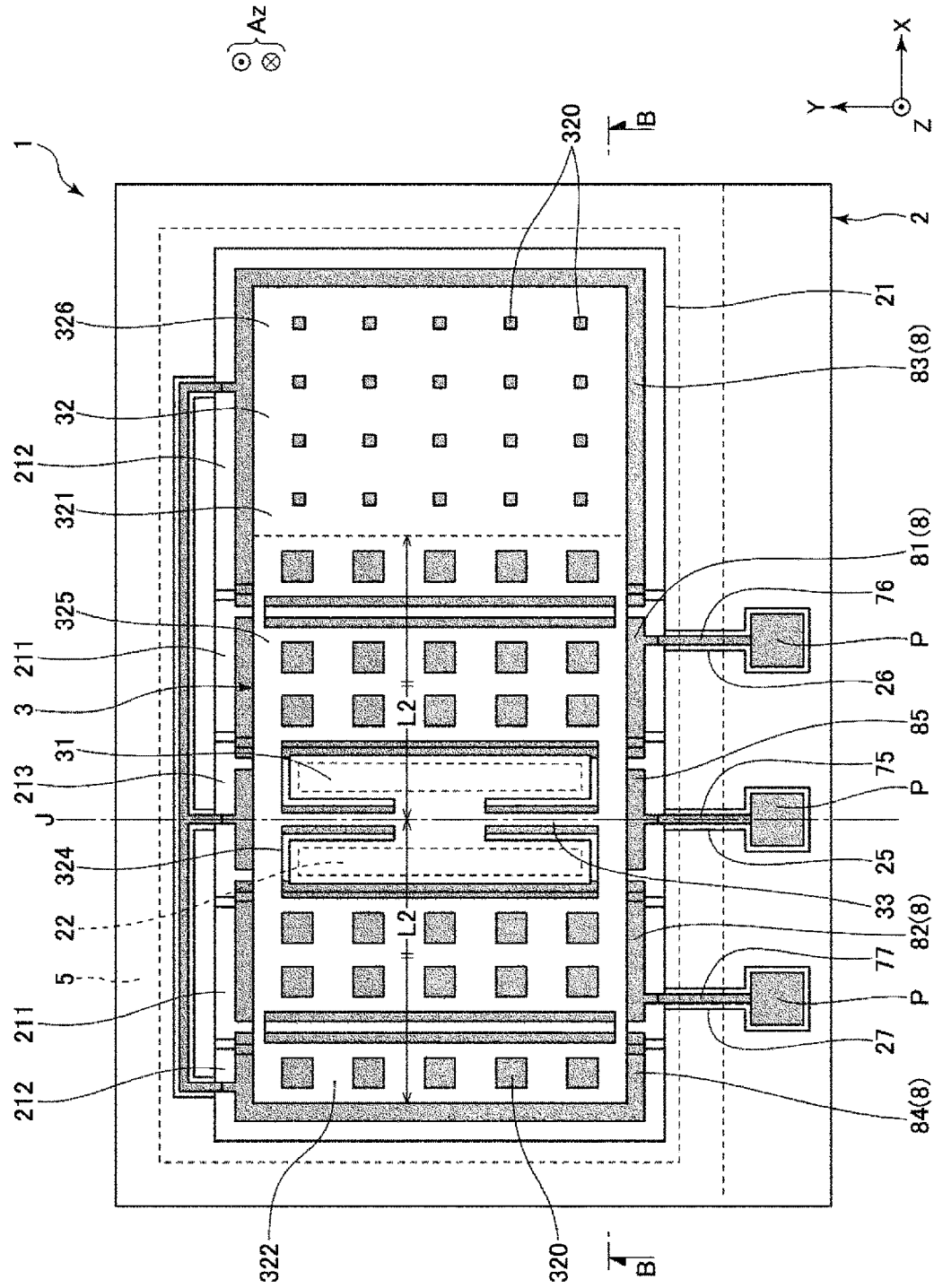
FIG. 3 is a plan view showing an inertial sensor according to a second embodiment.
Figure 4:
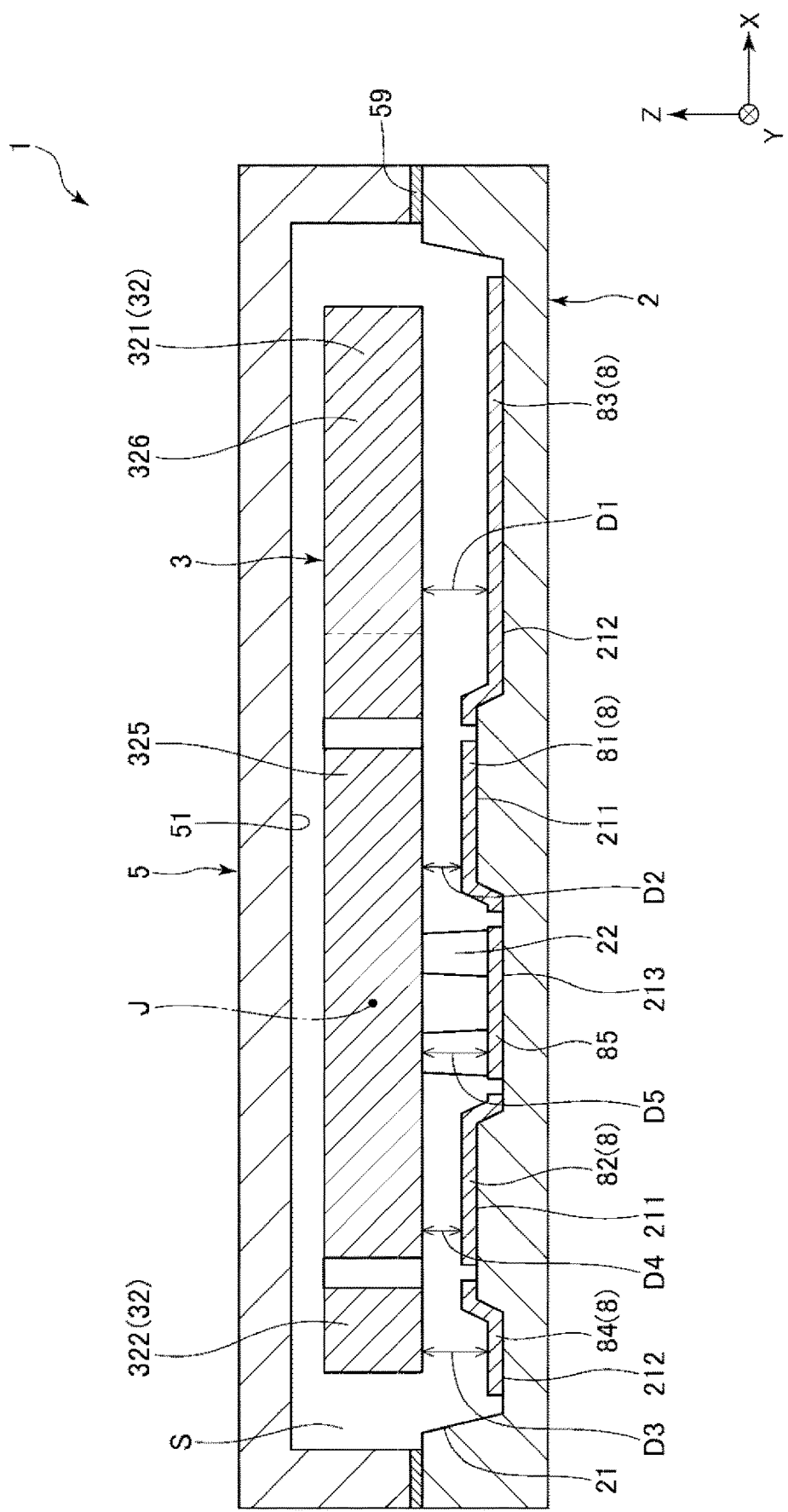
FIG. 4 is a cross-sectional view of the inertial sensor taken along the line B-B in FIG. 3.

FIG. 3 is a plan view showing an inertial sensor according to a second embodiment. FIG. 4 is a cross-sectional view of the inertial sensor taken along the line B-B in FIG. 3.

The present embodiment is the same as the first embodiment described above except the recess 21 is configured differently. The following description of the present embodiment will be primarily made of the difference from the embodiment described above, and the same items as those in the embodiment described above will not be described. In FIGS. 3 and 4, the same configurations as those in the embodiment described above have the same reference characters.

The recess 21 in the present embodiment is so formed in the plan view along the axis-Z direction that a portion 213, which are located between the two portions 211, where the first and second detection electrodes 81, 82 are provided, and where the third dummy electrode 85 is provided, is deeper than the portions 211, as shown in FIGS. 3 and 4. A separation distance D5 between the movable element 32 and the third dummy electrode 85 is therefore greater than the separation distance D2 between the first movable section 321 and the first detection electrode 81 and the separation distance D4 between the second movable section 322 and the second detection electrode 82. That is, D5>D2 and D5>D4 are satisfied. According to the configuration described above, since the separation distance between the movable element 32 and the third dummy electrode 85 is greater than that in the first embodiment described above, the air resistance that occurs when the movable element 32 swings lowers accordingly, whereby the damping of the movable element 32 can be reduced. A desired frequency band of the inertial sensor 1 is therefore readily ensured.

In the present embodiment, D5=D1=D3 is satisfied. The configuration in which the portions 212 and 213 have the same depth as described above allows the recess 21 to be readily formed. It is, however, noted that the separation distance D5 is not limited to a specific depth and may be smaller or greater than the separation distances D1 and D3.

As described above, the inertial sensor 1 according to the present embodiment includes the third dummy electrode 85, which is located between the first detection electrode 81 and the second detection electrode 82 and so provided as to overlap with the movable element 32 in the plan view along the axis-Z direction. The separation distance D5 between the movable element 32 and the third dummy electrode 85 is greater than the separation distance D2 between the first movable section 321 and the first detection electrode 81 and the separation distance D4 between the second movable section 322 and the second detection electrode 82. That is, D5>D2 and D5>D4 are satisfied. According to the configuration described above, since the separation distance D5 is greater than that in the first embodiment described above, the air resistance that occurs when the movable element 32 swings lowers accordingly, whereby the damping of the movable element 32 can be reduced. A desired frequency band of the inertial sensor 1 is therefore readily ensured.

The thus configured second embodiment can also provide the same effects as those provided by the first embodiment described above.

Third Embodiment

Figure 5:
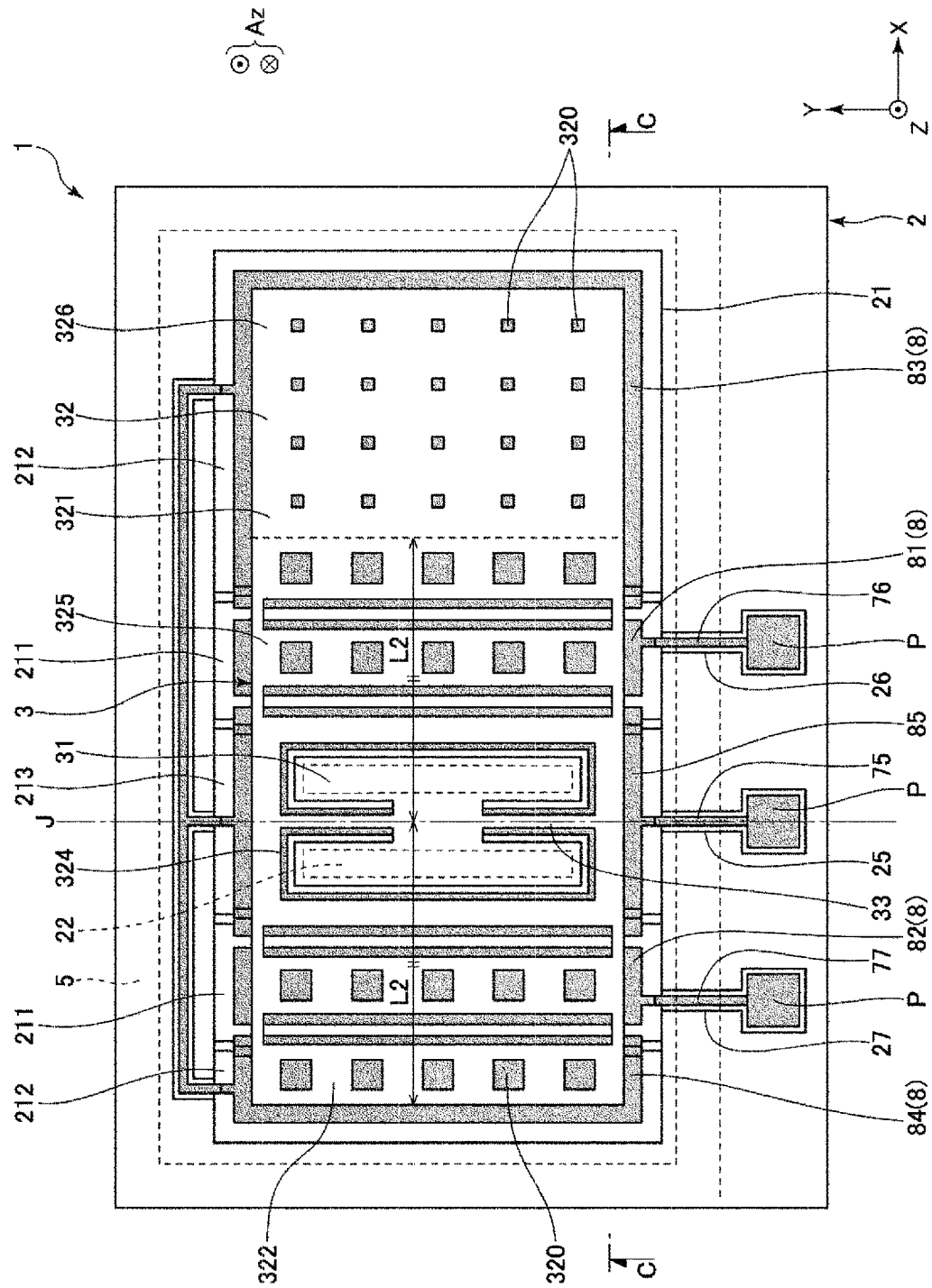
FIG. 5 is a plan view showing an inertial sensor according to a third embodiment.
Figure 6:
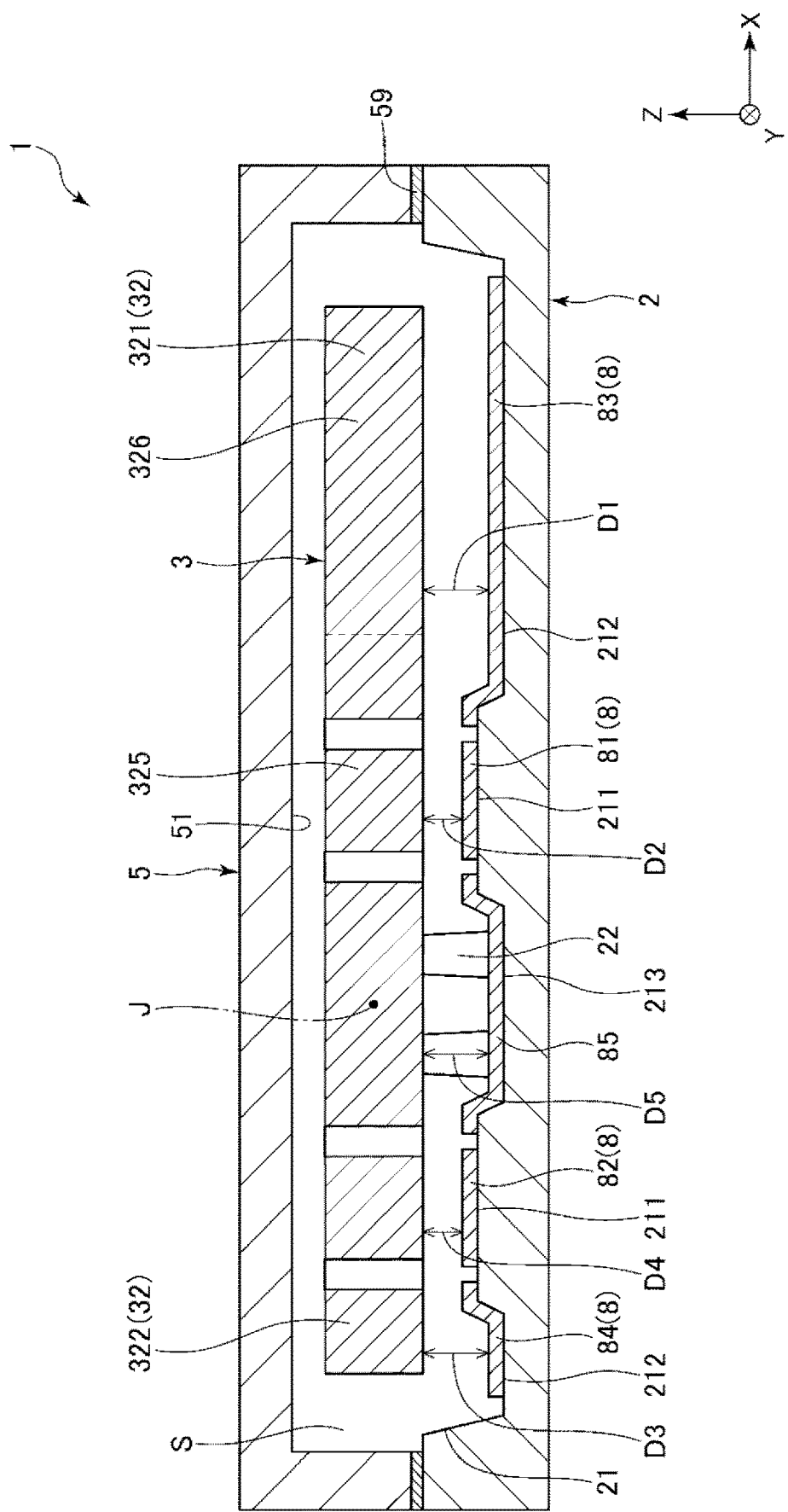
FIG. 6 is a cross-sectional view of the inertial sensor taken along the line C-C in FIG. 5.

FIG. 5 is a plan view showing an inertial sensor according to a third embodiment. FIG. 6 is a cross-sectional view of the inertial sensor taken along the line C-C in FIG. 5.

The present embodiment is the same as the second embodiment described above except the third dummy electrode 85 is arranged differently. The following description of the present embodiment will be primarily made of the difference from the embodiments described above, and the same items as those in the embodiments described above will not be described. In FIGS. 5 and 6, the same configurations as those in the embodiments described above have the same reference characters.

The third dummy electrode 85 in the present embodiment has a frame-like shape and is so disposed as to surround the entire circumference of the mount 22 in the plan view along the axis-Z direction, as shown in FIG. 5. According to the configuration described above, the area of the portion 213, where the separation distance to the movable element 32 is D5, increases as compared with the area in the second embodiment described above, and the air resistance that occurs when the movable element 32 swings can be lowered accordingly. The damping of the movable element 32 can therefore be reduced, whereby a desired frequency band of the inertial sensor 1 is readily ensured.

The thus configured third embodiment can also provide the same effects as those provided by the first embodiment described above.

Fourth Embodiment

Figure 7:
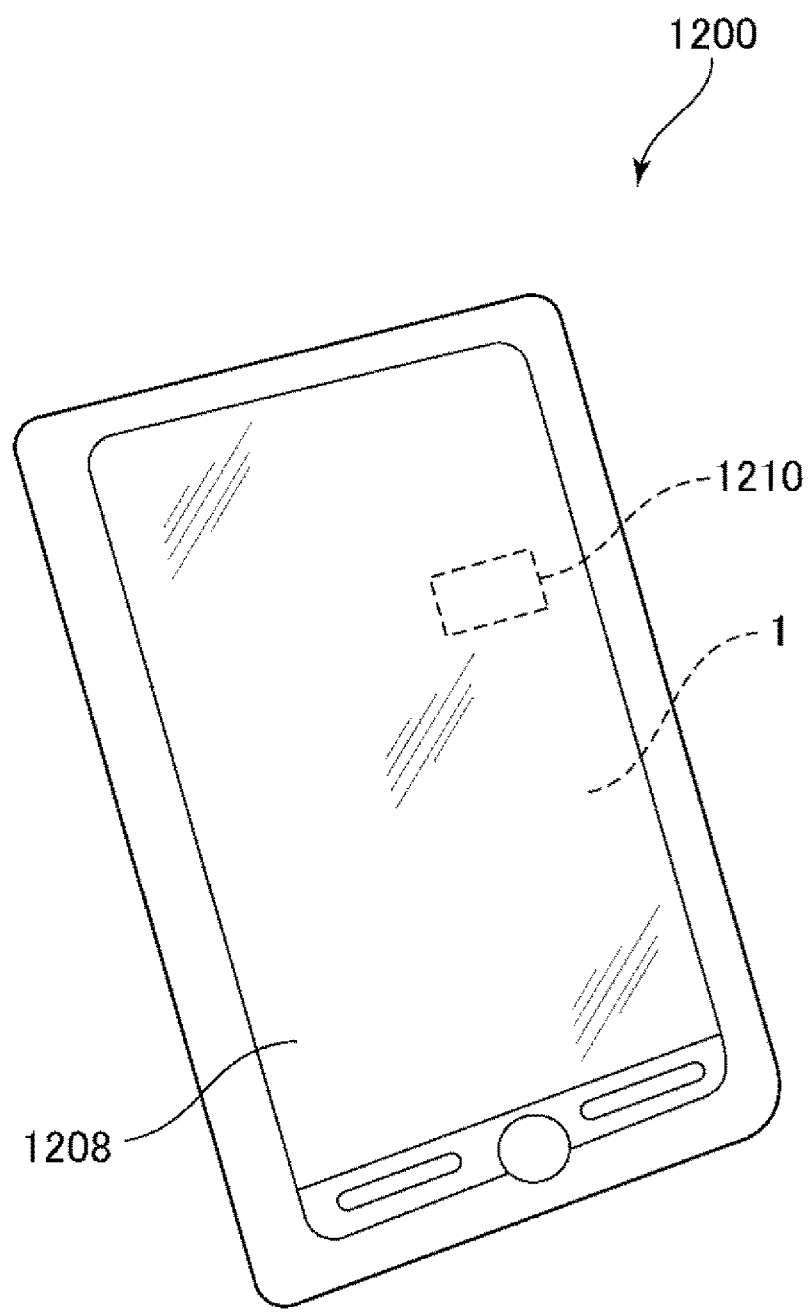
FIG. 7 is a plan view showing a smartphone as an electronic instrument according to a fourth embodiment.

FIG. 7 is a plan view showing a smartphone as the electronic instrument according to a fourth embodiment.

A smartphone 1200 shown in FIG. 7 is a smartphone based on the electronic instrument according to the present disclosure. The smartphone 1200 accommodates the inertial sensor 1 and a control circuit 1210, which performs control based on a detection signal outputted from the inertial sensor 1. Detection data detected by the inertial sensor 1 is transmitted to the control circuit 1210, and the control circuit 1210 recognizes the attitude and behavior of the smartphone 1200 based on the received detection data and can change an image displayed on a display section 1208, issue an alarm sound or an effect sound, and drive a vibration motor to vibrate the main body of the smartphone 1200.

The thus configured smartphone 1200 as the electronic instrument includes the inertial sensor 1 and the control circuit 1210, which performs control based on the detection signal outputted from the inertial sensor 1. The smartphone 1200 can therefore benefit from the above-mentioned effects provided by the inertial sensor 1 and hence have high reliability.

The electronic instrument according to the present disclosure is not limited to the smartphone 1200 described above and can, for example, be a personal computer, a digital still camera, a tablet terminal, a timepiece, a smartwatch, an inkjet printer, a laptop personal computer, a television receiver, smart glasses, a wearable terminal, such as a head mounted display (HMD), a video camcorder, a video tape recorder, a car navigator, a drive recorder, a pager, an electronic notepad, an electronic dictionary, an electronic translator, a desktop calculator, an electronic game console, a toy, a word processor, a workstation, a TV phone, a security television monitor, electronic binoculars, a POS terminal, a medical instrument, a fish finder, a variety of measuring instruments, an instrument for a mobile terminal base station, a variety of meters for car, railway car, airplane, helicopter, and ship, a flight simulator, and a network server.

Fifth Embodiment

Figure 8:
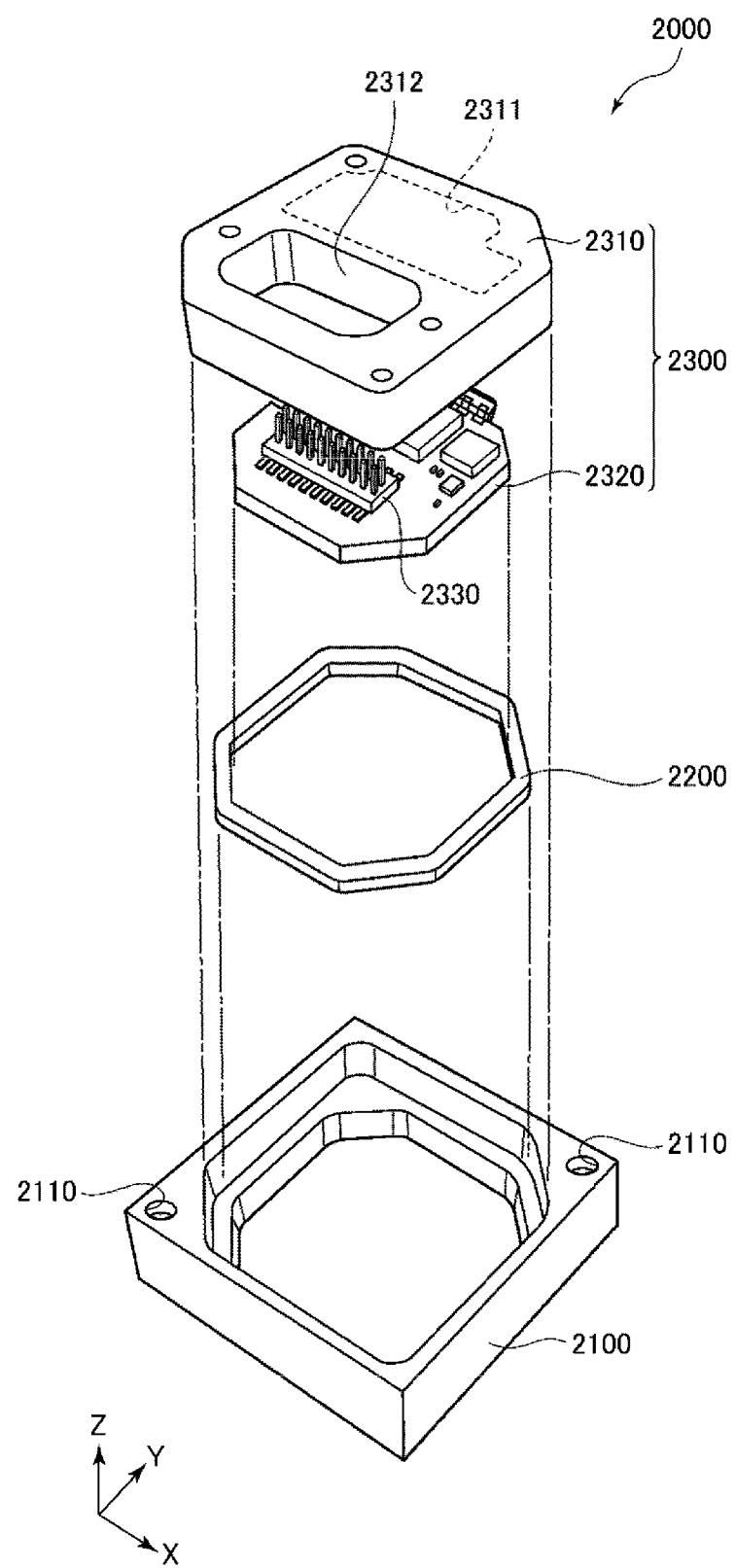
FIG. 8 is an exploded perspective view showing an inertial measurement unit as the electronic instrument according to a fifth embodiment.
Figure 9:
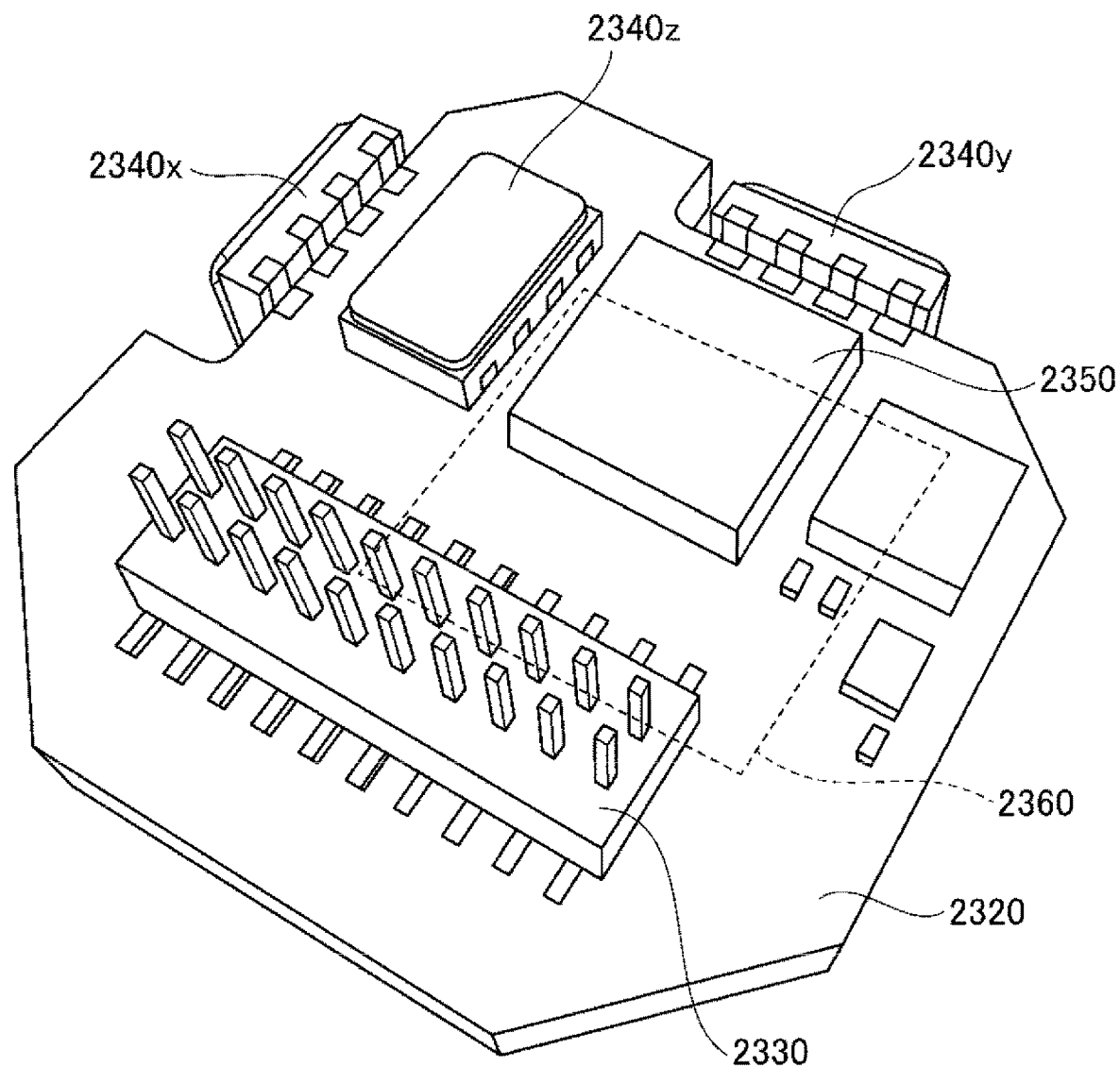
FIG. 9 is a perspective view of a substrate provided in the inertial measurement unit shown in FIG. 8.

FIG. 8 is an exploded perspective view showing an inertial measurement unit as the electronic instrument according to a fifth embodiment. FIG. 9 is a perspective view of a substrate provided in the inertial measurement unit shown in FIG. 8.

An inertial measurement unit 2000 (IMU) as the electronic instrument shown in FIG. 8 is an inertial measurement unit that detects the attitude and behavior of an apparatus to which the inertial measurement unit 2000 is attached, such as an automobile and a robot. The inertial measurement unit 2000 functions as a six-axis motion sensor including a three-axis acceleration sensor and a three-axis angular velocity sensor.

The inertial measurement unit 2000 is a rectangular parallelepiped unit having a substantially square shape in the plan view. Threaded holes 2110 as fixing sections are formed in the vicinity of two vertices of a square body that are vertices located on a diagonal of the square. Two screws screwed into the two threaded holes 2110 can fix the inertial measurement unit 2000 to an attachment surface of the apparatus to which the inertial measurement unit 2000 is attached, such as an automobile. The inertial measurement unit 2000 can be so reduced in size as to be incorporated, for example, in a smartphone and a digital camera by part selection and design change.

The inertial measurement unit 2000 includes an outer enclosure 2100, a bonding member 2200, and a sensor module 2300, and the sensor module 2300 is inserted into the outer enclosure 2100 via the bonding member 2200. The outer shape of the outer enclosure 2100 is a rectangular parallelepiped having a substantially square shape in the plan view, as is the overall shape of the inertial measurement unit 2000 described above. The threaded holes 2110 are formed in the vicinity of two vertices of the square outer enclosure 2100 that are vertices located on a diagonal of the square. The outer enclosure 2100 has a box-like shape, and the sensor module 2300 is accommodated in the outer enclosure 2100.

The sensor module 2300 includes an inner enclosure 2310 and a substrate 2320. The inner enclosure 2310 is a member that supports the substrate 2320 and is so shaped as to be accommodated in the outer enclosure 2100. The inner enclosure 2310 has a recess 2311, which prevents the inner enclosure 2310 from coming into contact with the substrate 2320, and an opening 2312, which exposes a connector 2330, which will be described later. The thus configured inner enclosure 2310 is bonded to the outer enclosure 2100 via the bonding member 2200. The substrate 2320 is bonded to the lower surface of the inner enclosure 2310 with an adhesive.

The connector 2330, an angular velocity sensor 2340z, which detects angular velocity around the axis Z, an acceleration sensor 2350, which detects acceleration in the axes X, Y, and Z, and other components are mounted on the upper surface of the substrate 2320, as shown in FIG. 9. An angular velocity sensor 2340x, which detects angular velocity around the axis X, and an angular velocity sensor 2340y, which detects angular velocity around the axis Y, are mounted on the side surface of the substrate 2320. Any of the inertial sensors according to the present disclosure can be used as the acceleration sensor 2350.

A control IC 2360 is mounted on the lower surface of the substrate 2320. The control IC 2360 is a micro controller unit (MCU) and controls each portion of the inertial measurement unit 2000. A storage stores a program that specifies the order and content for detecting the acceleration and angular velocity, a program that digitizes detected data and incorporates the digitized data in packet data, data associated with the programs, and other pieces of information. A plurality of other electronic parts are also mounted on the substrate 2320.

Sixth Embodiment

Figure 10:
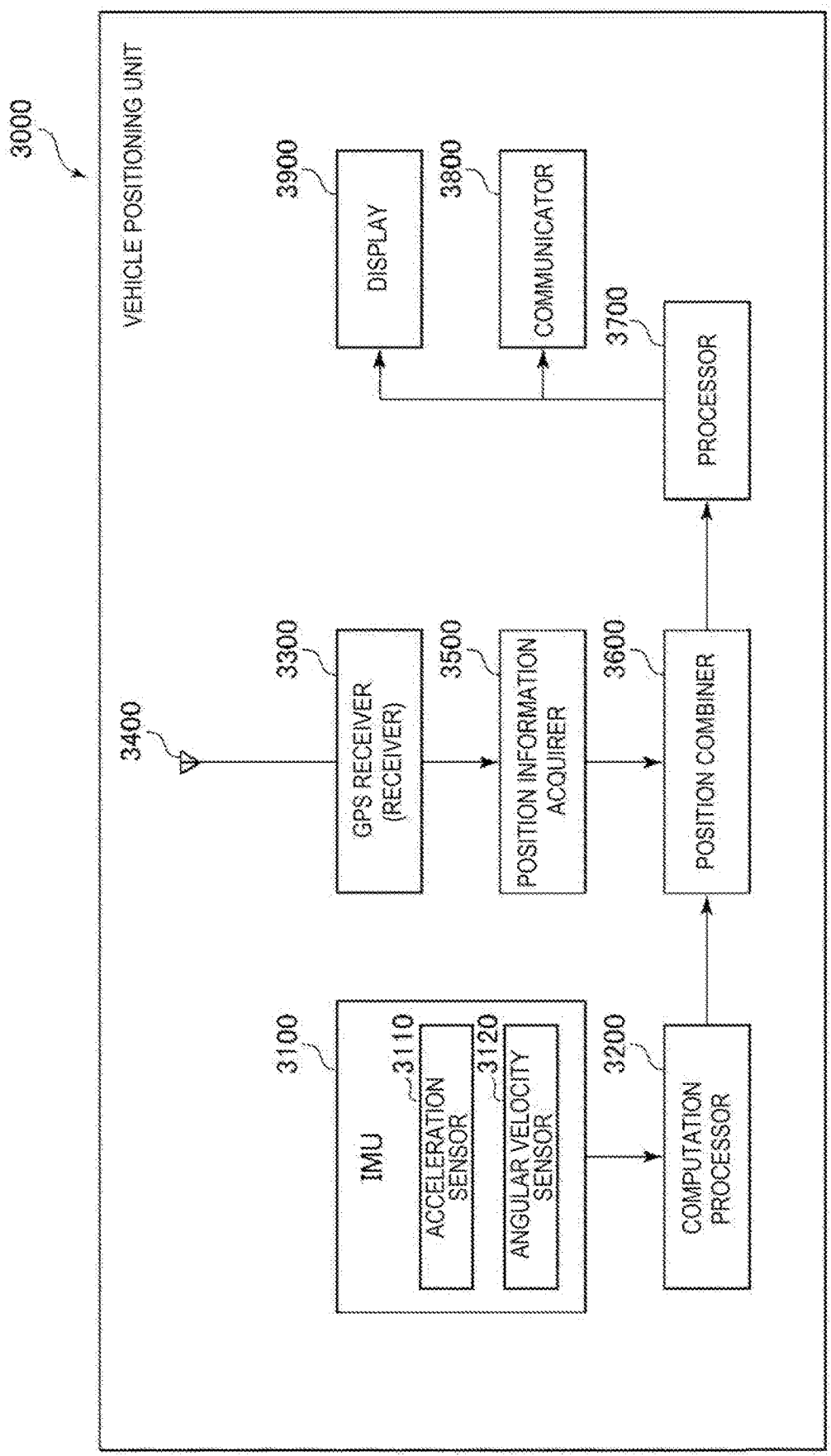
FIG. 10 is a block diagram showing the overall system of a vehicle positioning unit as the electronic instrument according to a sixth embodiment.
Figure 11:
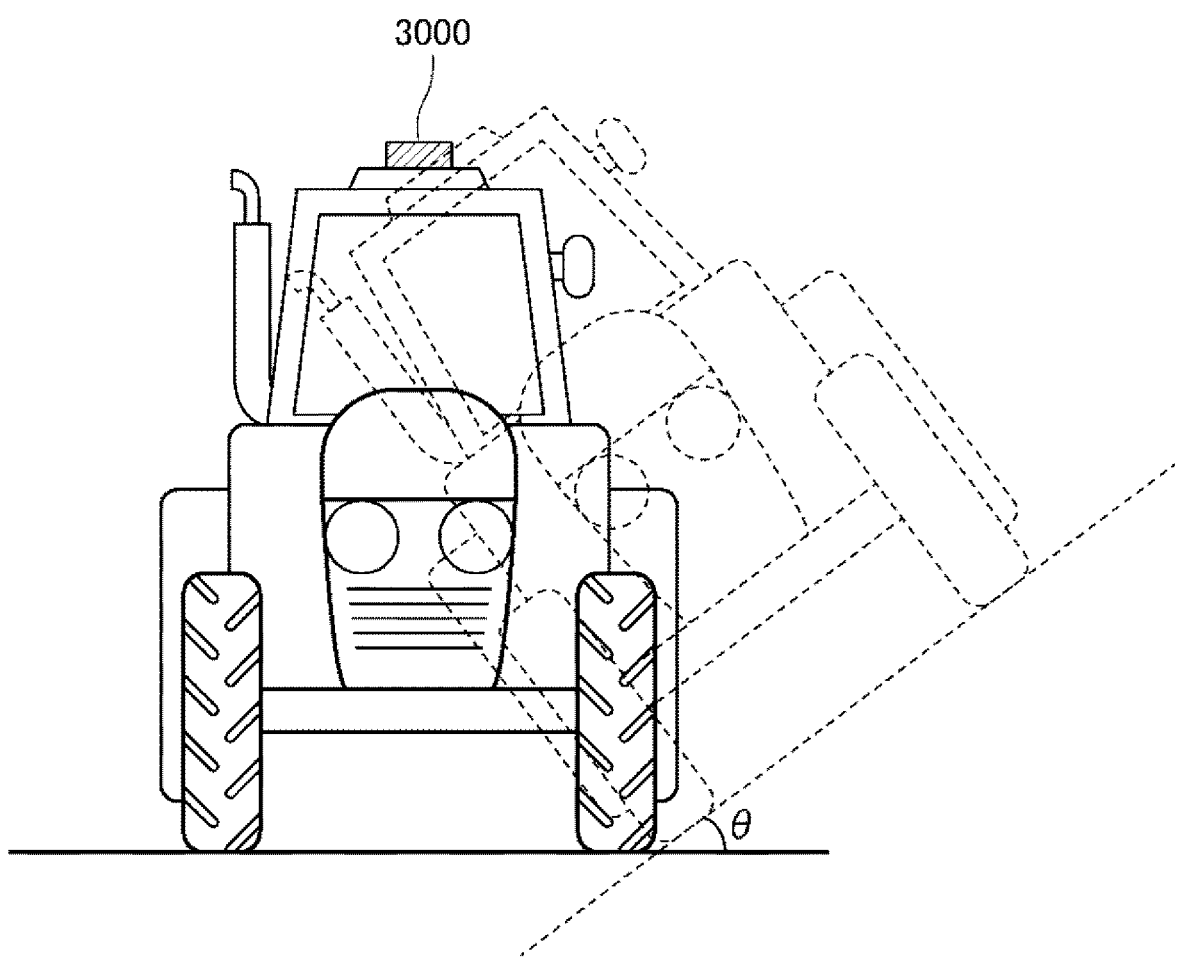
FIG. 11 shows an effect of the vehicle positioning unit shown in FIG. 10.

FIG. 10 is a block diagram showing the overall system of a vehicle positioning unit as the electronic instrument according to a sixth embodiment. FIG. 11 shows an effect of the vehicle positioning unit shown in FIG. 10.

A vehicle positioning unit 3000 shown in FIG. 10 is a unit that is attached to a vehicle when used and measures the position of the vehicle. The vehicle is not limited to a specific vehicle and may be any of a bicycle, an automobile, an autocycle, a train, an airplane, a ship, and other vehicles, and the present embodiment will be described with reference to a case where a four-wheeled automobile, particularly, an agricultural tractor is used as the vehicle.

The vehicle positioning unit 3000 includes an inertial measurement unit 3100 (IMU), a computation processor 3200, a GPS receiver 3300, a reception antenna 3400, a position information acquirer 3500, a position combiner 3600, a processor 3700, a communicator 3800, and a display 3900. The inertial measurement unit 3100 can, for example, be the inertial measurement unit 2000 described above.

The inertial measurement unit 3100 includes a three-axis acceleration sensor 3110 and a three-axis angular velocity sensor 3120. The computation processor 3200 receives acceleration data from the acceleration sensor 3110 and angular velocity data from the angular velocity sensor 3120, performs inertial navigation computation on the data, and outputs inertial navigation positioning data containing the acceleration and attitude of the vehicle.

The GPS receiver 3300 receives signals from GPS satellites via the reception antenna 3400. The position information acquirer 3500 outputs GPS positioning data representing the position (latitude, longitude, and altitude), velocity, and orientation of the vehicle positioning unit 3000 based on the signals received by the GPS receiver 3300. The GPS positioning data also contains status data representing the reception state, the reception time, and other pieces of information.

The position combiner 3600 calculates the position of the vehicle, specifically, the position on the ground along which the vehicle is traveling based on the inertial navigation positioning data outputted from the computation processor 3200 and the GPS positioning data outputted from the position information acquirer 3500. For example, even when the positions of the vehicle contained in the GPS positioning data are equal to one another, but the vehicle has a different attitude due to inclination e of the ground and other factors, as shown in FIG. 11, the position on the ground along which the vehicle is traveling varies. An accurate position of the vehicle cannot therefore be calculated based only on the GPS positioning data. In this case, the position combiner 3600 uses the inertial navigation positioning data to calculate the position on the ground along which the vehicle is traveling.

The processor 3700 performs predetermined processing on position data outputted from the position combiner 3600, and the processed data is displayed as the result of the positioning on the display 3900. The position data may be transmitted via the communicator 3800 to an external apparatus.

Seventh Embodiment

Figure 12:
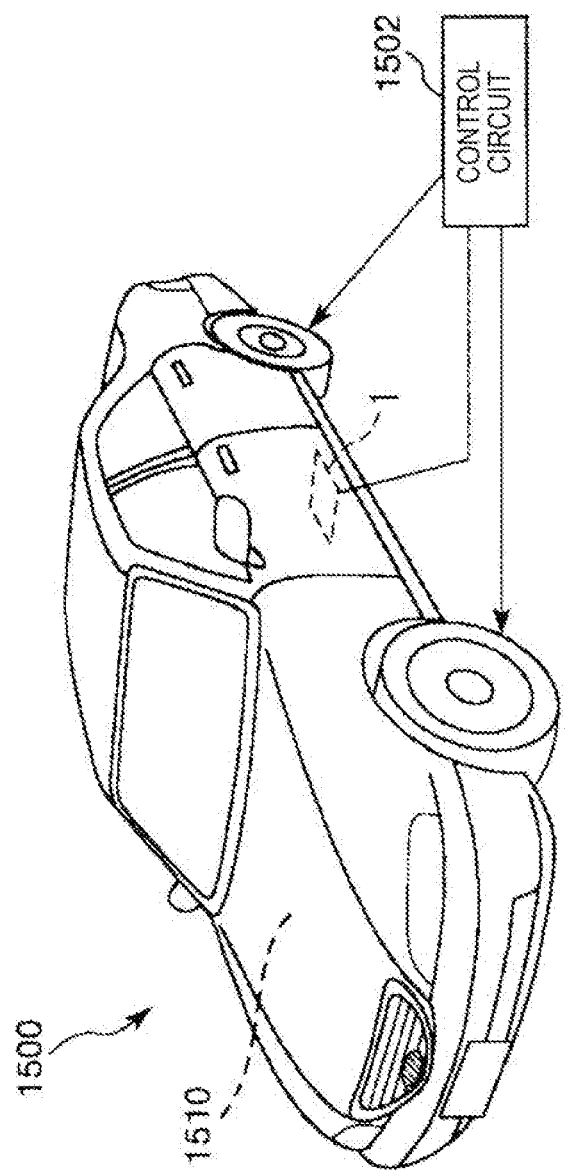
FIG. 12 is a perspective view showing a vehicle according to a seventh embodiment.

FIG. 12 is a perspective view showing a vehicle according to a seventh embodiment.

An automobile 1500 shown in FIG. 12 is an automobile based on the vehicle according to the present disclosure. In FIG. 12, the automobile 1500 includes a system 1510, which is at least any of an engine system, a brake system, and a keyless entry system. The inertial sensor 1 is built in the automobile 1500 and can detect the attitude of the vehicle body. The detection signal from the inertial sensor 1 is supplied to a control circuit 1502, which can control the system 1510 based on the signal.

As described above, the automobile 1500 as the vehicle includes the inertial sensor 1 and the control circuit 1502, which performs control based on the detection signal outputted from the inertial sensor 1. The automobile 1500 can therefore benefit from the above-mentioned effects provided by the inertial sensor 1 and hence have high reliability.

The inertial sensor 1 can also be widely used with a car navigation system, a car air conditioner, an anti-lock braking system (ABS), an airbag, a tire pressure monitoring system (TPMS), an engine control system, and an electronic control unit (ECU) that monitors or otherwise observes a battery in a hybrid automobile and an electric automobile. The vehicle is not limited to the automobile 1500 and may instead, for example, be a railway car, an airplane, a helicopter, a rocket, an artificial satellite, a ship, an automated guided vehicle (AGV), an elevator, an escalator, a radio control model, a railway mode, and other toys, a bipedal walking robot, and a drone or any other unmanned airplane.

The inertial sensor, the electronic instrument, and the vehicle according to the present disclosure have been described above based on the embodiments in the drawings, but the present disclosure is not limited thereto, and the configuration of each portion can be replaced with an arbitrary configuration having the same function. Further, another arbitrarily constituent part may be added to the present disclosure. The embodiments described above may be combined with each other as appropriate.

What is claimed is:

1. An inertial sensor comprising:
provided that axes X, Y, and Z are three axes perpendicular to one another,
a substrate;
a movable element that swings around a swing axis extending along the axis Y; and
an electrode that is disposed on the substrate and overlaps with the movable element in a plan view along the axis-Z direction,
wherein the movable element includes a first movable section and a second movable section so provided as to sandwich the swing axis in the plan view along the axis-Z direction,
the first movable section includes a symmetrical section that is so provided that the symmetrical section and the second movable section are symmetrical with respect to the swing axis in the plan view along the axis-Z direction and an asymmetrical section that is farther from the swing axis than the symmetrical section and so provided that the asymmetrical section and the second movable section are asymmetrical with respect to the swing axis in the plan view along the axis-Z direction, with rotational moment of the first movable section around the swing axis being greater than rotational moment of the second movable section around the swing axis,
the electrode includes a first detection electrode that is so provided as to overlap with the symmetrical section of the first movable section in the plan view along the axis-Z direction and a first dummy electrode that is so provided as to overlap with the symmetrical section and the asymmetrical section of the first movable section on a side farther from the swing axis than the first detection electrode and has the same potential as potential at the movable element, and
a separation distance between the symmetrical section and the first dummy electrode is greater than a separation distance between the symmetrical section and the first detection electrode,
wherein the electrode includes a second detection electrode that is so provided as to overlap with the second movable section in the plan view along the axis-Z direction and a second dummy electrode that is so provided as to overlap with the second movable section on a side farther from the swing axis than the second direction electrode and has the same potential as the potential at the movable element, and
a separation distance between the second movable section and the second dummy electrode is greater than a separation distance between the second movable section and the second detection electrode.

2. The inertial sensor according to claim 1, wherein a separation distance between the asymmetrical section and the first dummy electrode is greater than the separation distance between the symmetrical section and the first detection electrode.

3. The inertial sensor according to claim 1,
wherein the electrode includes a third dummy electrode that is located between the first detection electrode and the second detection electrode and so provided as to overlap with the movable element in the plan view along the axis-Z direction, and
a separation distance between the movable element and the third dummy electrode is greater than the separation distance between the symmetrical section and the first detection electrode and the separation distance between the second movable section and the second detection electrode.

4. The inertial sensor according to claim 1, wherein holes that pass through the movable element in the axis-Z direction are provided in each of the first movable section and the second movable section.

5. An electronic instrument comprising:
the inertial sensor according to claim 1; and
a control circuit that performs control based on a detection signal outputted from the inertial sensor.

6. A vehicle comprising:
the inertial sensor according to claim 1; and
a control circuit that performs control based on a detection signal outputted from the inertial sensor.

7. An inertial sensor comprising:
a substrate;
a movable element that swings around a swing axis, the movable element including:
a first movable section having a first section, a second section that is farther from the swing axis than the first section, and a third section disposed between the first section and second section;
a second movable section;
a first detection electrode disposed on the substrate so as to overlap with the first section of the first movable section in the plan view;
a first dummy electrode disposed on the substrate so as to overlap with the second section and the third section of the first movable section in the plan view,
a separation distance between the third section and the first dummy electrode is greater than a separation distance between the first section and the first detection electrode.

8. The inertial sensor according to claim 7, wherein a separation distance between the second section and the first dummy electrode is greater than the separation distance between the first section and the first detection electrode.

9. The inertial sensor according to claim 7, further including:
a second detection electrode that is so provided as to overlap with the second movable section in the plan view; and
a second dummy electrode that is so provided as to overlap with the second movable section on a side farther from the swing axis than the second detection electrode,
wherein a separation distance between the second movable section and the second dummy electrode is greater than a separation distance between the second movable section and the second detection electrode.

10. The inertial sensor according to claim 9, further including:
a third dummy electrode that is located between the first detection electrode and the second detection electrode and so provided as to overlap with the movable element in the plan view, and
a separation distance between the movable element and the third dummy electrode is greater than the separation distance between the first section of the first movable section and the first detection electrode and the separation distance between the second movable section and the second detection electrode.

11. The inertial sensor according to claim 7, wherein holes that pass through the movable element in the axis-Z direction are provided in each of the first movable section and the second movable section.

12. An electronic instrument comprising:
   the inertial sensor according to claim 7; and
   a control circuit that performs control based on a detection signal outputted from the inertial sensor.

13. A vehicle comprising:
   the inertial sensor according to claim 7; and
   a control circuit that performs control based on a detection signal outputted from the inertial sensor.

* * * * *